United States Patent [19]

Kolbesen

[11] 4,409,075
[45] Oct. 11, 1983

[54] METHOD FOR CUTTING A SEMICONDUCTOR CRYSTAL INTO WAFERS

[75] Inventor: Bernd Kolbesen, Munich, Fed. Rep. of Germany

[73] Assignee: Siemens Aktiengesellschaft, Berlin and Munich, Fed. Rep. of Germany

[21] Appl. No.: 283,374

[22] Filed: Jul. 15, 1981

[30] Foreign Application Priority Data

Aug. 6, 1980 [DE] Fed. Rep. of Germany ....... 3029792

[51] Int. Cl.[3] .............................. C25F 3/12; B23P 1/10
[52] U.S. Cl. .............................. 204/129.3; 204/129.46; 204/129.65; 204/224 M
[58] Field of Search ............. 204/129.3, 129.46, 129.6, 204/129.65, 129.75, 224 M

[56] References Cited

U.S. PATENT DOCUMENTS 3,128,213  4/1964  Gault et al. .................. 204/129.6 X
3,962,052  6/1976  Abbas et al. ................ 204/129.65 X
4,096,619  6/1978  Cook, Jr. ................... 204/129.65 X
4,193,852  3/1980  Inoue ............................ 204/129.46

FOREIGN PATENT DOCUMENTS 51-98973  8/1976  Japan ............................. 204/129.65
201867   11/1967  U.S.S.R. ........................ 204/129.46

Primary Examiner—Donald R. Valentine
Attorney, Agent, or Firm—Herbert L. Lerner; Laurence A. Greenberg

[57] ABSTRACT

Method of separating a semiconductor crystal, in particular a rod-like semiconductor crystal, into wafers by first providing it with a masking layer of non-conducting material interrupted by stripes. The semiconductor crystal is biased as an anode and is immersed in an electrolyte which is provided with an electrode serving as the cathode. The oxide layers produced in the regions of the semiconductor crystal which are not masked, are removed mechanically.

23 Claims, 3 Drawing Figures

METHOD FOR CUTTING A SEMICONDUCTOR CRYSTAL INTO WAFERS

BACKGROUND OF THE INVENTION

1. Field of the Invention

The invention relates to a method for cutting a semiconductor crystal, particularly a rod-like semiconductor crystal, into wafers, and to the wafers made by the process.

2. Description of the Prior Art

Semiconductor components such as diodes, transistors, thyristors, integrated circuits or solar cells are made as a rule from semiconductor wafers which are cut from rod-like, usually monocrystalline semiconductor crystals. Mechanical sawing processes are used which operate mainly in accordance with the internal-hole principle for cutting off the wafers. These sawing processes, have, for one, the disadvantage that the loss of semiconductor material, relative to the thickness of the wafers, is 50 to 100 percent. In addition, one wafer after another must be cut off with these methods and the expense timewise as well as equipmentwise is therefore considerable.

SUMMARY OF THE INVENTION

It is an object of the present invention to correct this situation and to provide a method for cutting semiconductor crystals into wafers wherein a substantially smaller amount of waste is produced as compared to the known methods.

With the foregoing and other objects in view, there is provided in accordance with the invention, an electrolytic-mechanical method of separating a semiconductor crystal, in particular a rod-like semiconductor crystal, into wafers, which comprises coating a semiconductor crystal with a masking layer of non-conducting material interrupted by stripes, immersing the semiconductor crystal with masking layer and stripes in an electrolyte provided with an electrode as a cathode and with th semiconductor crystal biased as an anode to form an electrolyzer, applying an electric current to the electrolyzer to produce oxide layers in the striped regions which are not masked by the masking layer, mechanically removing the oxide layers and separating the semiconductor crystal into a plurality of wafers.

Other features which are considered as characteristic for the invention are set forth in the appended claims.

Although the invention is illustrated and described herein as embodied in a method for cutting a semiconductor crystal into wafers, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DETAILED DESCRIPTION OF THE INVENTION

In accordance with the invention, the semiconductor crystal is provided with a masking layer of non-conductive material which is interrupted by stripes. The semiconductor crystal is biased as an anode and is immersed in an electrolyte provided with an electrode acting as a cathode. The oxide layers generated in the unmasked regions of the semiconductor crystal are mechanically removed. This makes it possible to substantially reduce the amount of waste of semiconductor material produced in the cutting and to keep the apparatus required for the cutting process small.

If a rod-like semiconductor body is used it is advantageous to arrange the stripes interrupting the masking layer parallel to each other in ring-fashion and in planes which are approximately perpendicular to the longitudinal axis of the crystal.

The masking layer can be interrupted, for instance by means of a photolithographic process, by means of scribing or by means of laser radiation in stripe-fashion in such a manner that the etchant can attack the semiconductor rod only in those places at which the masking layer on the outer surface of the crystal rod is removed or damaged.

Advantageously, the masking layer is interrupted by stripes 50 to 200 $\mu$m and in particular, 80 to 120 $\mu$m wide, and the masking layer is interrupted in stripe-fashion at spacings of at least 200 $\mu$m.

It is within the scope of the invention that (a) a fluorine-containing electrolyte, for instance hydrofluoric acid is used; (b) an oxide, particularly $SiO_2$ or $Al_2O_3$ or $Si_3N_4$ is used as the masking layer; (c) the oxide layers produced in the not masked region of the semiconductor crystal are removed by the mechanical action of at least one wire or blade; (d) the mechanical action is caused by moving the wire or the blade back and forth; (e) the mechanical action is exerted perpendicularly to the surface of the semiconductor crystal; and (f) a wire or a blade of metal, particularly iron, copper or molybdenum is used.

To shorten the fabrication time, it is of advantage to use several wires or blades arranged parallel to each other, to rotate the semiconductor crystal about its longitudinal axis, for instance at a speed chosen in the range between about 1 and 10 rpm; and to heat the electrolyte to a suitable temperature.

The invention will be explained in the following, making reference to FIGS. 1 to 3 which should be considered as an embodiment example.

Figure 1:
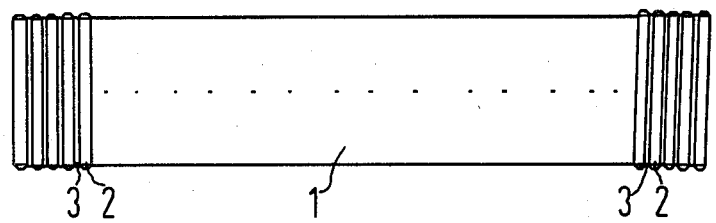
FIG. 1 shows a semiconductor crystal rod which is provided with a masking layer which is interrupted by ring-like stripes.

FIG. 1 shows a silicon crystal rod 1 which is ground round and covered by a masking layer 2, shown only partially for reasons of simplicity, and in which the masking layer 2 has been removed at equidistant spacings in the form of annular stripes 3. The annular stripes are arranged parallel to each other in planes perpendicular to the longitudinal axis of the crystal. The stripes 3 can be generated by a phototechnical process followed by etching, by scribing, by laser radiation or some other technique.

It is sufficient to damage the masking layer in such a way that the electrolyte can later attack the silicon at these points. Subsequently, the silicon crystal rod 1, provided with the annular stripe 3, is placed in a bath filled with an electrolyte, for instance hydrofluoric acid. The silicon crystal is biased as an anode while a metal electrode arranged in the electrolytic bath serves as the cathode. The current flowing to the places of the silicon crystals which are not covered by the masking layer 2, namely, at the annular stripes 3, leads to the formation of an oxide layer 7 in the area through which current flows, which inhibits the further flow of current. Through the mechanical action of a metal wire 8, arranged perpendicularly to the longitudinal axis of the silicon crystal 1, for instance a back-and forth movement of the wire 8, pressure being exerted in the direction toward the center of the rod, the part of the oxide layer 7 which is parallel to the outer cylinder surface of the rod, is continuously removed so that grooves 4 are formed in the semiconductor rod 1.

Figure 2:
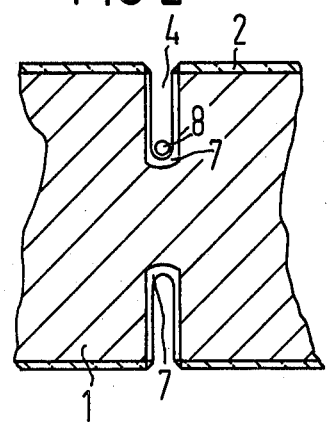
FIGS. 2 and 3 show in cross section, fractions of the crystal rod in different process stages.
Figure 3:
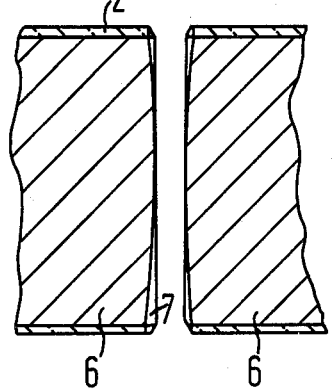

If the semiconductor rod 1 is rotated about its longitudinal axis during the execution of the process, the grooves 4 are annular, as shown in FIG. 2. If the process is continued, the semiconductor rod falls apart and forms individual wafers 6, as is shown in FIG. 3 in a fractional view.

It is advantageous to provide as many parallel wires 8 or corresponding metal blades as there are stripes 3. This makes it possible to cut off all the wafers from a rod simultaneously and not, as in the known mechanical sawing processes, wafer after wafer.

Depending on the size of the electrolytic bath, several semiconductor rods can be cut into wafers at the same time. The loss of semiconductor material or silicon is at least 50% less in the method according to the invention than with conventional mechanical sawing processes.

The masking layer 2 should not be attacked by the electrolyte at all or more slowly by at least a factor $10^4$ to $10^6$ than the semiconductor material to be oxidized. Oxides, for instance $Al_2O_3$ or non-conductive silicon compounds can be used as the insulating masking layer. The masking layer can be applied by thermal oxidation, by vapor deposition, cathode sputtering, electroplating or similar processes.

In addition to silicon, which finds the most frequent application, semiconductors such as, for instance germanium or III–V compounds in monocrystalline or polycrystalline form can also be treated. If the stripes interrupting the masking layer are arranged in semiconductor rods not in ring-fashion at the crystal cylinder surface but parallel to the axis of the rod at the cylinder surface of the crystal, it is possible to cut the semiconductor rod not into annular wafers but into board-like discs or slabs, the length of which is essentially identical with the length of the semiconductor rod. Such board, made in particular from silicon rods or blocks, can advantageously be processed further into solar cells or serve as the starting material for large-area solar cells.

The width of the stripe-like interruptions 3 of the masking layer 2 is best chosen in the range between 50 and 200 μm, because if too narrow, the strength of the wire 8 would be too low, and if too wide, the cutting waste would be too large. A width of the stripes 3 in the range of 80 to 120 μm is advantageous. The spacing between the individual stripes 3 should be at least 200 μm for self-supporting silicon wafers and depends otherwise on the application of the cut-off wafers. The width of the wire or blade is chosen in accordance with the width of the stripes used. Metals such as iron, copper or molybdenum can be considered as the material for the wire 8 or a blade.

EXAMPLE

A monocrystalline silicon rod with a diameter of 100 mm is first ground round to obtain, among other things, a uniform masking coating. Subsequently, a masking layer 2 of aluminum oxide approximately 1 μm thick is applied. Then, the masking layer 2 is removed by means of a photolithographic process in annular stripes 3 approximately 100 μm wide, which stripes are arranged at spacings of about 400 μm. Subsequently, the silicon crystal is mounted in a bath of 10-percent hydrofluoric acid, rotatable about its longitudinal axis. A metal electrode serving as a cathode is arranged in the electrolyte, and the silicon crystal is biased as an anode with 10 volts. A molybdenum wire with a cross section of 100 μm was used as separating wire. The separation of the wafers took about 3 days at 25° C. electrolyte temperature and a speed of revolution of the rod of 7 rpm (revolutions per minute). The lateral underoxidation is then about 100 μm, i.e. 50 μm on each side. With an original stripe width of 100 μm, the silicon loss is therefore approximately 200 μm. With an original wafer thickness of 400 μm, this corresponds to a loss of 50% of silicon due to the electrolytic-mechanical separation. With conventional sawing processes on the other hand, the sawing loss is up to 100%, referred to the thickness of the wafers.

The same results are obtained if silicon dioxide is used as the masking layer and the masking layer is interrupted in stripe form by scribing with a diamond.

There is claimed:

1. An electrolytic-mechanical method of separating a semiconductor crystal, in particular a rod-like semiconductor crystal, into wafers, which comprises coating a semiconductor crystal with a masking layer of non-conducting material interrupted by stripes, immersing the semiconductor crystal with masking layer and stripes in an electrolyte provided with an electrode as a cathode and with the semiconductor crystal biased as an anode to form an electrolyzer, applying an electric current to the electrolyzer to produce oxide layers in the striped regions which are not masked by the masking layer, mechanically removing the oxide layers and separating the semiconductor crystal into a plurality of wafers, wherein a rod-like semiconductor crystal is used and the stripes interrupting the masking layer are arranged, parallel to each other and in ring-fashion, in planes approximately perpendicular to the longitudinal axis of the crystal.

2. Method according to claim 1, wherein the masking layer is interrupted in stripe-fashion by means of a photolithographic process.

3. Method according to claim 1, wherein the masking is interrupted in stripe-fashion by means of scribing.

4. Method according to claim 2, wherein the masking layer is interrupted in stripe-fashion by means of laser radiation.

5. Method according to claim 1, wherein the masking layer is interrupted by stripes 50 to 200 μm wide.

6. Method according to claim 5, wherein the masking layer is interrupted at spacings of at least 200 μm in stripe-fashion.

7. Method according to claim 1, wherein the masking layer is interrupted by stripes 80 to 120 μm wide.

8. Method according to claim 1, wherein the electrolyte is a fluoride-containing electrolyte.

9. Method according to claim 1, wherin the electrolyte is dilute hydrofluoric acid.

10. Method according to claim 1, wherein the masking layer is an oxide.

11. Method according to claim 10, wherein the oxide is $SiO_2$.

12. Method according to claim 10, wherein the oxide is $Al_2O_3$.

13. Method according to claim 1, wherein the masking layer is $Si_3N_4$.

14. Method according to claim 1, wherein said oxide layers produced in the striped regions are removed by the mechanical action of at least one wire or blade.

15. Method according to claim 14, wherein the mechanical action is obtained by back-and forth movement of the wire or the blade.

16. Method according to claim 14, wherein the mechanical action is exerted perpendicularly to the surface of the semiconductor crystal.

17. Method according to claim 14, wherein said wire or blade is a metal selected from the group consisting of iron, copper and molybdenum.

18. Method according to claim 14, wherein several wires or blades are arranged parallel to each other.

19. Method according to calim 1, wherein the electrolyte is heated to decrease the time of procuding the oxide layers.

20. Semiconductor wafer produced in accordance with the method of claim 1.

21. An electrolytic-mechanical method of separating a semiconductor crystal, in particular a rod-like semiconductor crystal, into wafers, which comprises coating a semiconductor crystal with a masking layer of non-conducting material interrupted by stripes, immersing the semiconductor crystal with masking layer and stripes in an electrolyte provided with an electrode as a cathode and with the semiconductor crystal biased as an anode to form an electrolyzer, applying an electric current to the electrolyzer to produce oxide layers in the striped regions which are not masked by the masking layer, mechanically removing the oxide layers and separating the semiconductor crystal into a plurality of wafers, wherein the semiconductor crystal is rotated about its longitudinal axis.

22. Method according to claim 21, wherein the semiconductor crystal is rotated at a speed in the range between about 1 and 10 rpm.

23. An electrolytic-mechanical method of separating a semiconductor crystal, in particular a rod-like semiconductor crystal, into wafers, which comprises coating a semiconductor crystal with a masking layer of non-conducting material interrupted by stripes, immersing the semiconductor crystal with masking layer and stripes in an electrolyte provided with an electrode as a cathode and with the semiconductor crystal biased as an anode to form an electrolyzer, applying an electric current to the electrolyzer to produce oxide layers in the striped regions which are not masked by the masking layer, mechanically removing the oxide layers and separating the semiconductor crystal into a plurality of wafers, wherein said oxide layers produced in the striped regions are removed by the mechanical action of at least one wire or blade, and wherein the semiconductor crystal is rotated about its longitudinal axis.

* * * * *